United States Patent [19]

Ohta

[11] Patent Number: 5,469,517
[45] Date of Patent: Nov. 21, 1995

[54] MOTION COMPENSATION CIRCUIT

[75] Inventor: Mutsumi Ohta, Tokyo, Japan

[73] Assignee: NEC Corporation, Tokyo, Japan

[21] Appl. No.: 278,631

[22] Filed: Jul. 21, 1994

Related U.S. Application Data

[63] Continuation-in-part of Ser. No. 6,843, Jan. 21, 1993, abandoned.

[30] Foreign Application Priority Data

Jan. 21, 1992 [JP] Japan ......................................... 4-8010

[51] Int. Cl.$^6$ ....................................................... G06K 9/36
[52] U.S. Cl. ........................... 382/252; 348/398; 348/413; 348/416; 348/699
[58] Field of Search ............................ 382/56; 348/398, 348/413, 416, 155, 409, 699

[56] References Cited

U.S. PATENT DOCUMENTS

| | | | |
|---|---|---|---|
| 4,949,176 | 8/1990 | Levy | 348/409 |
| 4,969,040 | 11/1990 | Gharavi | 348/398 |
| 5,218,435 | 6/1993 | Lim et al. | 348/409 |
| 5,223,926 | 6/1993 | Stone et al. | 348/396 |

*Primary Examiner*—Leo H. Boudreau
*Assistant Examiner*—Phuoc Tran
*Attorney, Agent, or Firm*—Foley & Lardner

[57] ABSTRACT

A motion compensation circuit comprises finite impulse response (FIR) filters divided into N groups according to N subbands of input video signal samples. One of the FIR filters of each group receives a delayed version of the subband of the group, and the remainder of the group receives a delayed version of one or more of the subbands which are adjacent to the subband of the group. Each FIR filter has tap-weight multipliers controlled in response to an estimated motion vector for shifting sample points of each subband. N adders are provided corresponding respectively to the N groups of FIR filters for summing the outputs of the FIR filters of the corresponding groups to produce N motion compensation signals.

10 Claims, 5 Drawing Sheets

FIG. 5

MOTION COMPENSATION CIRCUIT

This is a continuation-in-part application of application Ser. No. 08/006,843, filed Jan. 21, 1993 now abandoned.

BACKGROUND OF THE INVENTION

1. Field of the Invention

The present invention relates generally to video signal coding techniques, and more specifically to a motion compensation circuit for shifting sample points of a two-dimensional signal according to an estimated motion vector.

2. Description of the Related Art

Subband coding technique is known and used as a means for compression of data by subdividing the frequency spectrum of a one-dimensional or two-dimensional signal into several subbands using subband analysis filters and down-sampling each subband signal. The subband signals are reconstructed by up-sampling each of the subband signals, passing the up-sampled signals through respective reconstruction filters and combining the outputs of the reconstruction filters. If the subband coding technique is used for a motion-compensated interframe prediction coder/decoder system, difficulty will arise for implementation due to the inherent ambiguity as to the position of an original sample on the frequency domain of the subband signals.

SUMMARY OF THE INVENTION

It is therefore an object of the present invention to provide a motion compensation circuit that enables implementation of a motion-compensated video transmission/recording system.

In a video encoder which comprises a subband separation circuit for separating a video signal of successive frames into N subbands, N differentiators are provided for deriving N prediction errors from the N subbands and from the outputs of a motion compensation (shifter) circuit. N first adders are included for summing the outputs of the motion compensation circuit with the N prediction errors, and N delay circuits introduce a predetermined amount of delay to each output of the N first adders. A motion estimator estimates a motion vector of each block of a successive frame. According to this invention, the motion compensation circuit comprises a plurality of finite impulse response (FIR) filters divided into N groups according to the N subbands. One of the FIR filters of each group receives a signal from one of the delay circuits which corresponds to the subband of the group, and the remainder of the group receives a signal from one or more of the delay circuits corresponding to one or more of the subbands which are adjacent to the subband of the group. Each of the FIR filters has a plurality of tap-weight multipliers controlled in response to the motion vector. N second adders are provided respectively corresponding to the N groups of FIR filters for summing the outputs of the FIR filters of the corresponding groups to produce N outputs and supplying them as the outputs of the motion compensation circuit to the N first adders and the N differentiators.

BRIEF DESCRIPTION OF THE DRAWINGS

The present invention will be described in further detail with reference to the accompanying drawings, in which.

DETAILED DESCRIPTION

Figure 1:
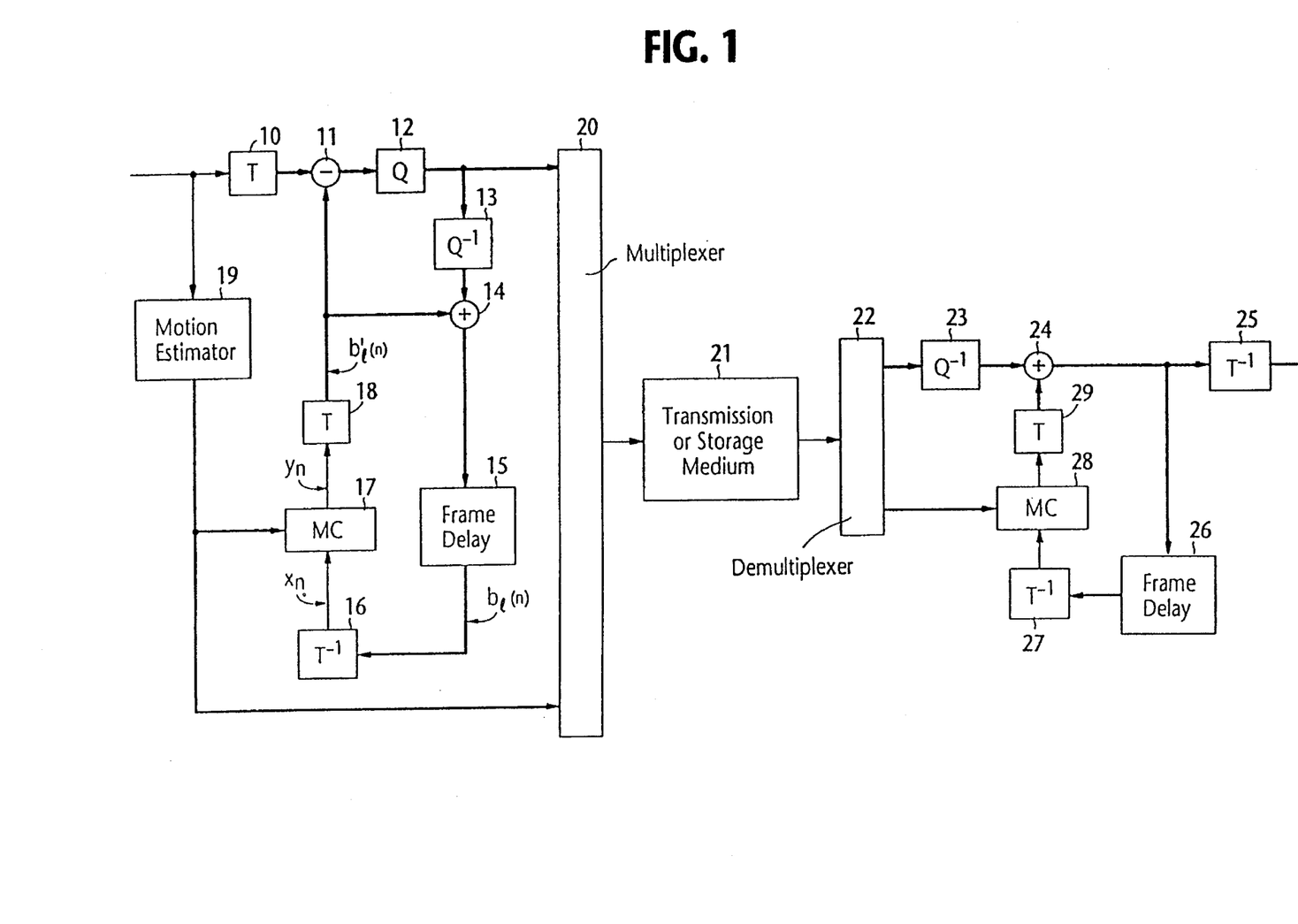
FIG. 1 is a block diagram of a motion-compensated interframe prediction encoder for describing the operating principle of the present invention.

Prior to the description of the present invention, it is appropriate to describe the principle of the present invention with reference to FIG. 1 which shows in schematic form an encoder circuit using a motion-compensation technique. The encoder comprises a subband analyzer 10 which transforms an input digital video signal by partitioning it into N subbands of different frequencies using a bank of digital separation bandpass filters and down-sampling (decimation) each of the subbands at 1/N of the original sample rate of the video signal to produce N sub-sampled digital bit streams. The outputs of subband analyzer 10 are applied to a subtractor unit 11 where they are subtractively combined with a set of N prediction data streams from a subband analyzer 18 identical to subband analyzer 10 to produce a set of N prediction error signals. The outputs of subtractor unit 11 are quantized by a quantizer unit 12 and applied to a multiplexer 20 where it is transmitted through a transmission medium 21 to a distant receiver or recorded in a suitable storage medium to be recovered by a reconstruction circuit. The outputs of quantizer unit 12 are further applied to a dequantizer unit 13 whose data streams are summed by an adder unit 14 with the prediction outputs from subband analyzer 18 to produce a set of N locally regenerated versions of the subband video signals. The outputs of adder unit 14 are delayed for a frame interval by a frame delay unit 15 and fed into a subband synthesizer 16 which performs a process inverse to that of the subband analyzers 10 and 18. Specifically, it oversamples each subband signal by inserting zero-valued samples (interpolation) and allows the interpolated signals to pass through digital reconstruction bandpass filters, respectively, and combines them into a single stream of data bits. The output of subband synthesizer 16 is applied to a motion compensation circuit, 17 which may be implemented with a finite impulse response filter. A motion estimator 19 is provided to divide each frame of the incoming video signal into a plurality of blocks and estimate the amount of motion vector of each block. A shift control signal representing the estimated motion vector is supplied from the motion estimator 19 to motion compensation circuit 17 in order to shift the point of each digital sample of a previous frame according to the estimated motion vector to compensate for spatial interframe differences. The shift control signal is multiplexed with the outputs of quantizer 12 and transmitted or recorded as side information to enable reconstruction of the original signal. A local feedback loop is completed by coupling the output of motion compensation circuit 17 to the input of subband analyzer 18, where the shifted sample is divided into N subbands and each subband is decimated at 1/N the rate of the input video signal. At the receiver or reconstruction circuit, the multiplexed signal is applied to a demultiplexer 22 where the individual video subband signals and side information are separated from each other. The subband video signals are dequantized by a dequantizer unit 23 and fed to an adder unit 24. The outputs of adder unit 24 are applied to a subband synthesizer 25 and to a frame delay unit 26 whose outputs are coupled to a subband synthesizer 27 where the individual subband signals are decoded and the frame-delayed version of the original video signal is recovered and applied to a motion compensation circuit 28 where the digital sample is shifted in response to the side information. The shifted samples are transformed into individual subbands by a subband analyzer 29 and applied to adder unit 24 to be respectively summed with the subband outputs of dequantizer unit 23.

Since each of the subband analyzer and subband synthesizer is complex and expensive to implement, the system of FIG. 1 as a whole would be considerably costly for practical applications. For low-cost implementation of the present invention, a quantitative analysis is given of the circuit comprising subband synthesizer 16, shifter 17 and subband analyzer 18 at the transmitter and of the circuit comprising subband synthesizer 27, shifter 28 and subband analyzer 29 at the receiver as follows:

$$x(n) = \sum_{l=0}^{N-1} \sum_{i=-\infty}^{\infty} b_l([n/N] + i) \cdot g_{mod(n,N)}(mod(n,N) - N \cdot i) \quad (1)$$

$$y(n) = x(n - r) \quad (2)$$

$$b'_l(n) = \sum_{m=-\infty}^{\infty} y(m) \cdot h_l(N \cdot n - m) \quad (3)$$

where, $x(n)$=the input signal of motion compensation circuit 17 or 28, $b_l(n)$=each subband input of subband synthesizer 16 or 27, where $l=1, 2 \ldots N$, and m and n are a sample indicator;

$i$=the indicator identifying each tap-weight multiplier of the motion compensation circuit 17 or 28, $g_l$=the impulse response of each reconstruction filter of subband synthesizer 16, $y(n)$=the output signal of motion compensation circuit 17 or 28, $r$=the estimated motion vector, $b'_l(n)$=each subband signal of subband analyzer 18 or 29, and $h_l$=the impulse response of each frequency separation filter of subband analyzer 18, or 29.

Equations (1), (2) and (3) can be combined as follows to produce a shifted sample output $b'_k(n)$ for each subband signal:

$$b'_k(n) = \sum_{m=-\infty}^{\infty} \sum_{l=0}^{N-1} \sum_{i=-\infty}^{\infty} b_l([m-r)/N] + i) \times \quad (4)$$

$$g_{mod(m-r,N)}(mod(m-r,N) - N \cdot i) \cdot h_k(N \cdot n - m) =$$

$$\sum_{l=0}^{N-1} \left\{ \sum_{m=-\infty}^{\infty} \sum_{i=-\infty}^{\infty} b_l([(m-r)/N] + i) \cdot S(m,n,i,l,r) \right\}$$

where, k is $1, 2 \ldots N$.

Equation (4) indicates that, by multiplying each digital sample $b_l(m)$ with weighting factors $S(m, n, i, l, r)$, summing the wrighted samples to produce a weighted sum for each subband frequency and further summing the weighted sums of all the subband frequencies, it is possible to provide shift (motion compensation) calculations of the digital samples on the domain of a subband frequency by the use of N finite impulse response filters for each of N subbands, a total of $N^2$ FIR filters, for shifting digital samples without using a subband synthesizer prior to shifting and a subband analyzer following the shift operation.

Figure 2A:
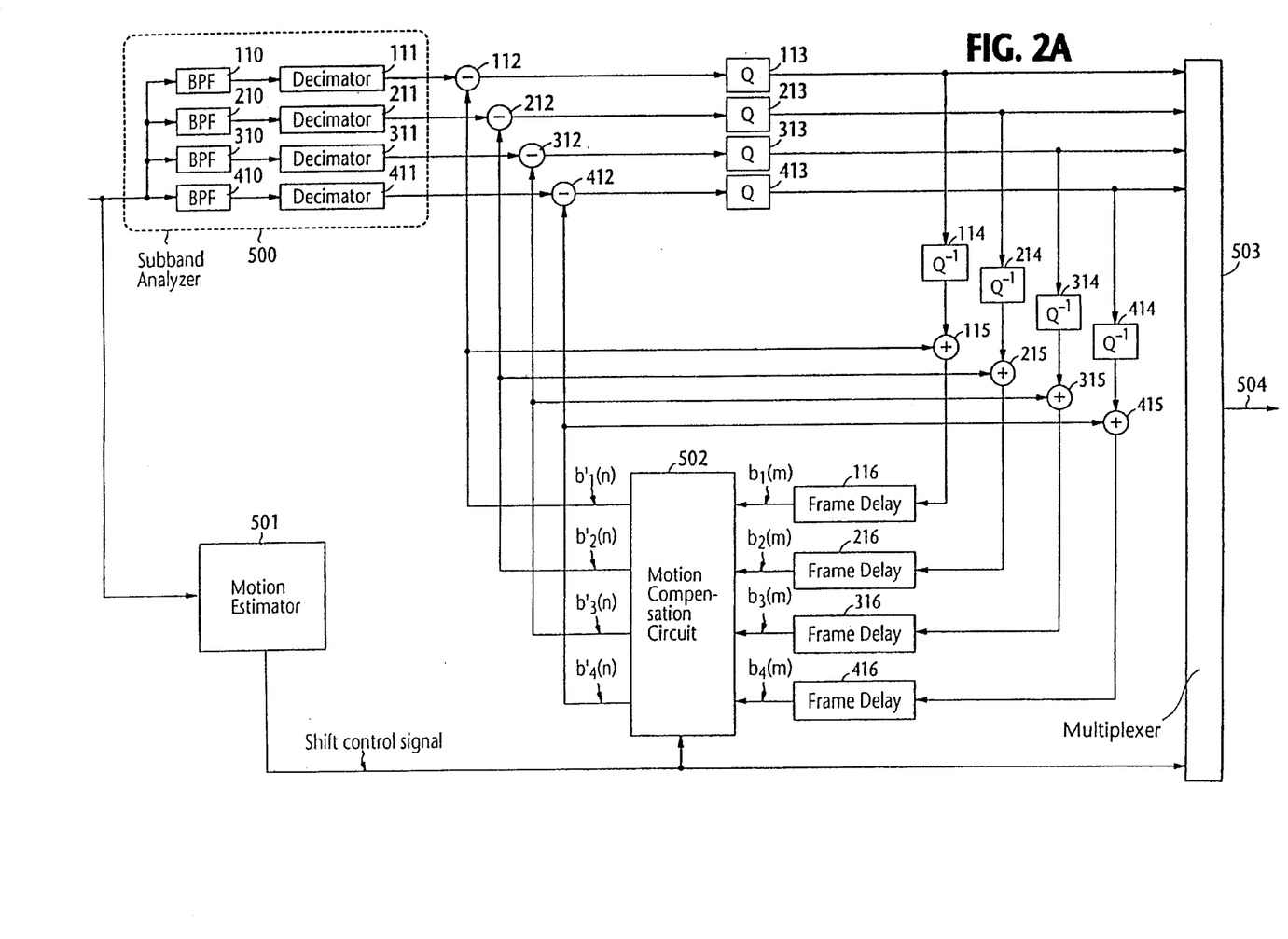
FIGS. 2A and 2B are block diagrams of a motion-compensated interframe prediction encoder and a motion-compensated interframe prediction decoder, respectively, according to the present invention.
Figure 2B:
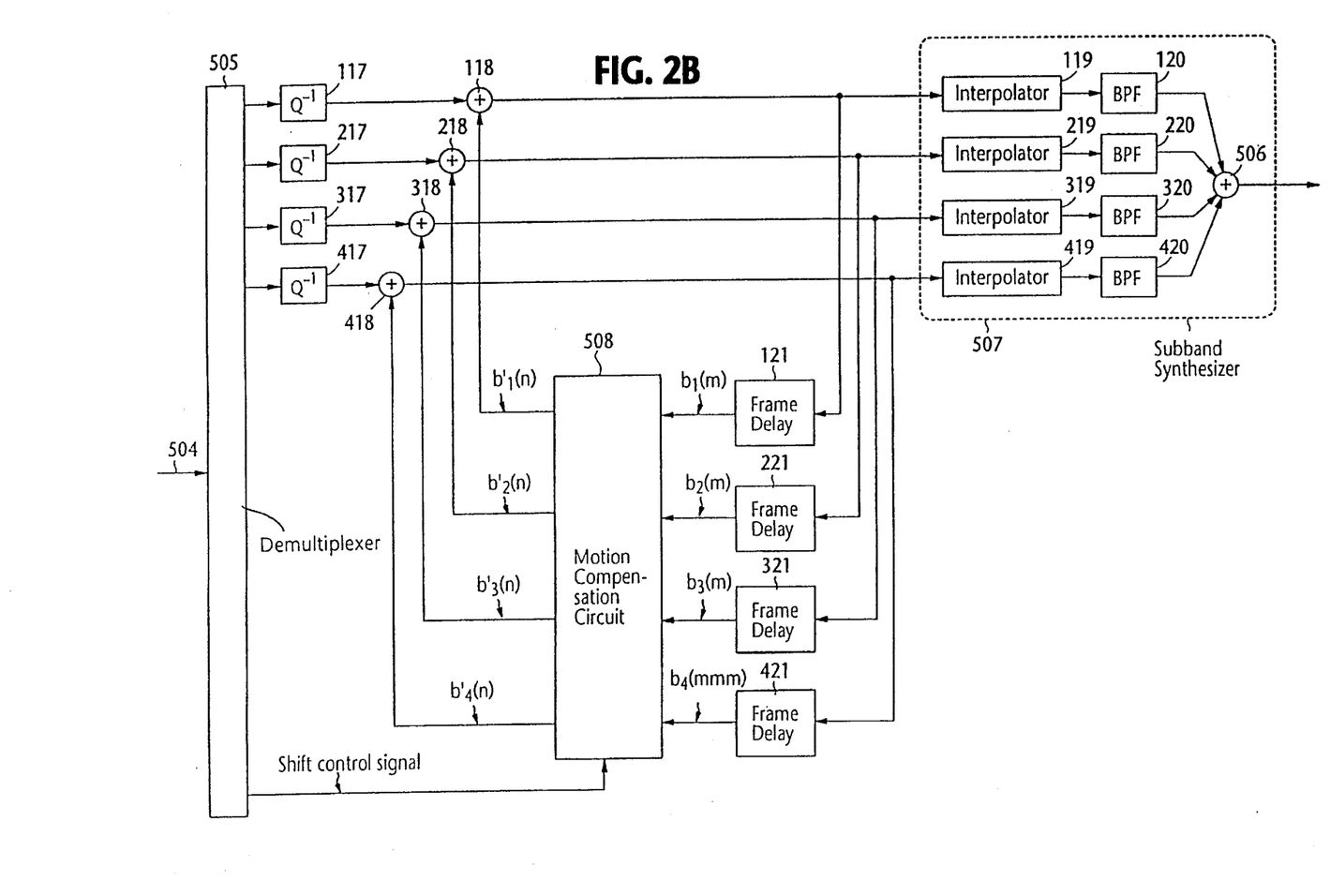

FIG. 2A is a block diagram of a motion-compensated interframe prediction encoder according to the present invention, and FIG. 2B is a block diagram of a motion-compensated interframe prediction decoder of the present invention.

In FIG. 2A, the encoder comprises a subband analyzer 500, a motion estimator 501 and a motion compensation circuit 502 the detail of which will be shown and described with reference to FIGS. 3 to 5. Subband analyzer 500 includes a filter bank of N (where N=4) bandpass filters 110, 210, 310, 410 connected to respond to a sequence of input digital video samples for subdividing the frequency spectrum of the samples into four subbands. The outputs of bandpass filters 110, 210, 310, 410 are coupled respectively to decimators 111, 211, 311, 411 where the digital samples of the respective subbands are decimated at a subsample rate which is ¼ of the original sample rate of the incoming video signal. The decimated subband outputs of subband analyzer 500 are coupled respectively to subtractors 112, 212, 312, 412 where prediction errors are detected by subtracting corresponding subband outputs of a motion compensation circuit 502 respectively from the outputs of subband analyzer 500. The outputs of subtractors 112, 212, 312, 412 are quantized by quantizers 113, 213, 313, 413, respectively, and supplied to a multiplexer 503 where they are multiplexed with a shift control signal supplied from the motion estimator 501 and transmitted over a communication channel 504 to (or recorded in a suitable storage medium to be reconstructed by) the motion-compensated interframe prediction decoder shown in FIG. 2B.

The outputs of quantizers 113, 213, 313, 413 are dequantized by corresponding dequantizers 114, 214, 314, 414, and summed respectively with the outputs of motion compensation circuit 502 by adders 115, 215, 315, 415. Following one frame interval delayed by corresponding frame delay circuits 116, 216, 316, 416, the outputs of adders 115, 215, 315, 415 are supplied to the motion compensation circuit 502.

Figure 3:
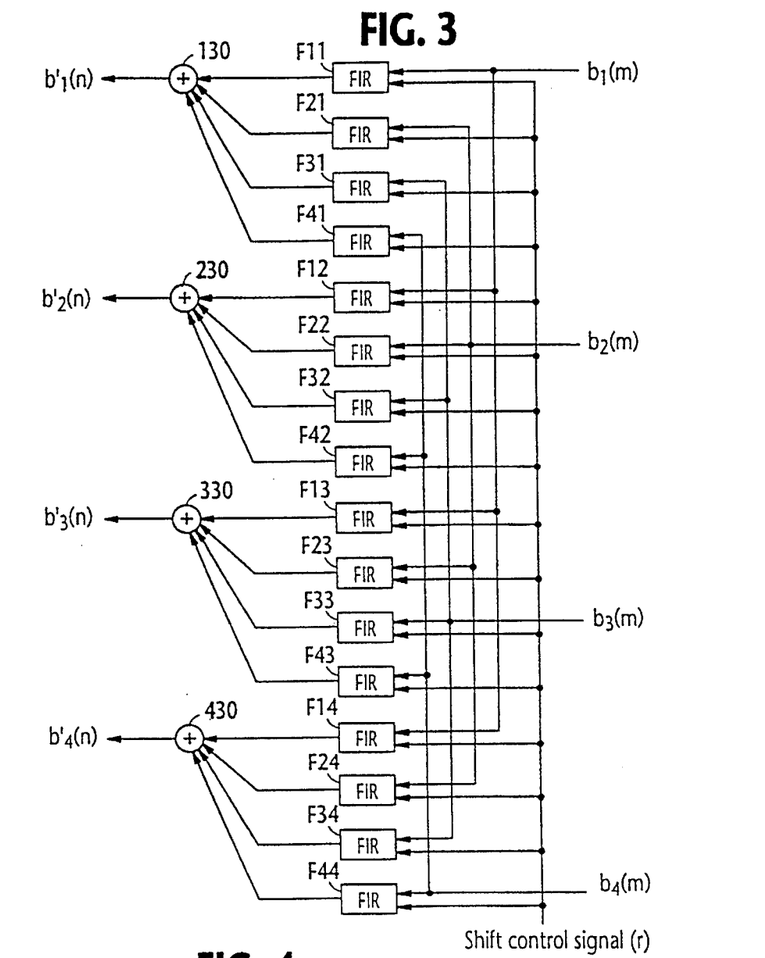
FIG. 3 is a block diagram of a motion compensation circuit according to one embodiment of the present invention.
Figure 4:
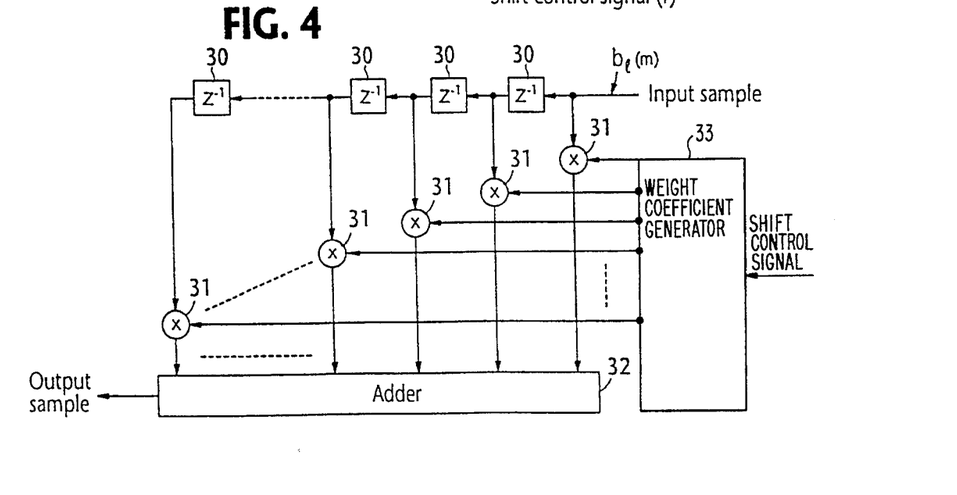
FIG. 4 is a block diagram of a finite impulse response filter of the present invention.

As shown in detail in FIG. 3, the motion compensation circuit comprises N (N=4) groups of N finite impulse response filters each having a set of weighting factors $S(m,n,i,l,r)$ of Equation 4. The first group comprises FIR filters F11, F21, F31 and F41, the second group comprising FIR filters F12, F22, F32, F42, the third group comprising FIR filters F13, F23, F33, F43, and the fourth group comprising FIR filters F14, F24, F34 and F44. The inputs of FIR filters F11, F12, F13 and F14 are connected together to the output of frame delay circuit 116, and the inputs of FIR filters F21, F22, F23 and F24 are connected together to the output of frame delay circuit 216. Likewise, the inputs of FIR filters F31, F32, F33, F34 are connected together to the output of frame delay circuit 316, and the inputs of FIR filters F41, F42, F43, F44 are connected together to the output of frame delay circuit 416. The shift control signal from the motion estimator 500 is supplied to all the FIR filters. The outputs of the FIR filters of the first, second, third and fourth groups are summed by adders 130, 230, 330 and 430, respectively, and applied to subtractors 112, 212, 312, 412 and adders 115, 215, 315, 415 as outputs of the motion compensation circuit 502. As typically shown in FIG. 4, the FIR filters comprises a tapped delay line formed by successive delay elements 30 to receive the output of the corresponding frame delay circuit to produce successively delayed versions of the locally decoded subband signal. A plurality of tap-weight multipliers 31 are connected respectively to successive taps of the delay line, and an adder 32 is provided to sum the outputs of the multipliers to produce shifted output samples. The shift control signal from the motion estimator 501 is supplied to a weight coefficient generator 33 to perform shift calculations according to Equation (4) to provide a plurality of tap weight coefficient signals to; the control terminals of the tap-weight multipliers 31. As can be seen from Equation (4), the tap weight coefficient signals will be unique for each FIR filter. The signals at the successive taps of the tapped delay line are multiplied with the respective tap weight coefficient signals and the weighted tap signals are then summed by adder 32.

The individual FIR filters of each group receive digital samples $b_1(m)$, $b_2(m)$, $b_3(m)$ and $b_4(m)$, respectively, from the corresponding frame delay circuits 116~416, and performs shift calculations of the double summation term of Equation (4) encapsulated between braces. The adder corresponding to that group provides summation of the outputs of these filters to complete the calculation of Equation (4) to supply an output sample $b'_k(n)$ to a corresponding one of subtractors 112~412.

In FIG. 2B, the motion-compensated interframe prediction decoder comprises a demultiplexer 505 where the quantized subband signals and the side information are separated from each other. The demultiplexed subband signals are fed into dequantizers 117, 217, 317, 417 and supplied to adders 118, 218, 318, 418, respectively. The outputs of these subtractors are coupled to a subband synthesizer 507 which comprises interpolators 119, 219, 319, 419 for up-sampling the outputs of adders 118~418 by inserting zero-value samples, and a bank of reconstruction bandpass filters 120, 220, 320, 420 coupled respectively to the outputs of interpolators 119, 219, 319, 419. The outputs of the reconstruction bandpass filters are summed by an adder 506 to generate a replica of the original video signal.

The outputs of adders 118~418 are further coupled to frame delay circuits 121, 221, 321, 421, respectively, where they are delayed one frame interval and applied to a motion compensation circuit 508 identical to the motion compensation circuit of the transmitter. Motion compensation circuit 508 is responsive to the side information from the demultiplexer 505 to shift the delayed subband signals $b_1(m)$, $b_2(m)$, $b_3(m)$, $b_4(m)$ to generate shifted samples $b'_1(n)$, $b'_2(n)$, $b'_3(n)$, $b'_4(n)$ in a manner exactly the same way as the motion compensation circuit 502 and supply them to adders 118, 218, 318, 418, respectively.

With the motion compensation circuit of FIG. 3, each subband requires N-1 finite impulse response filters for filtering all other subbands to produce correction terms which are summed with the term derived from the own subband. If all subbands were ideally separated from each other, the correction terms could be theoretically omitted. However, since the digital band separation filters have a finite number of taps, it is impossible to achieve ideal band separation. For a given subband, the correction terms of adjacent subband have significant values, while the correction terms of remote subbands are of such low, insignificant values that can be ignored.

Figure 5:
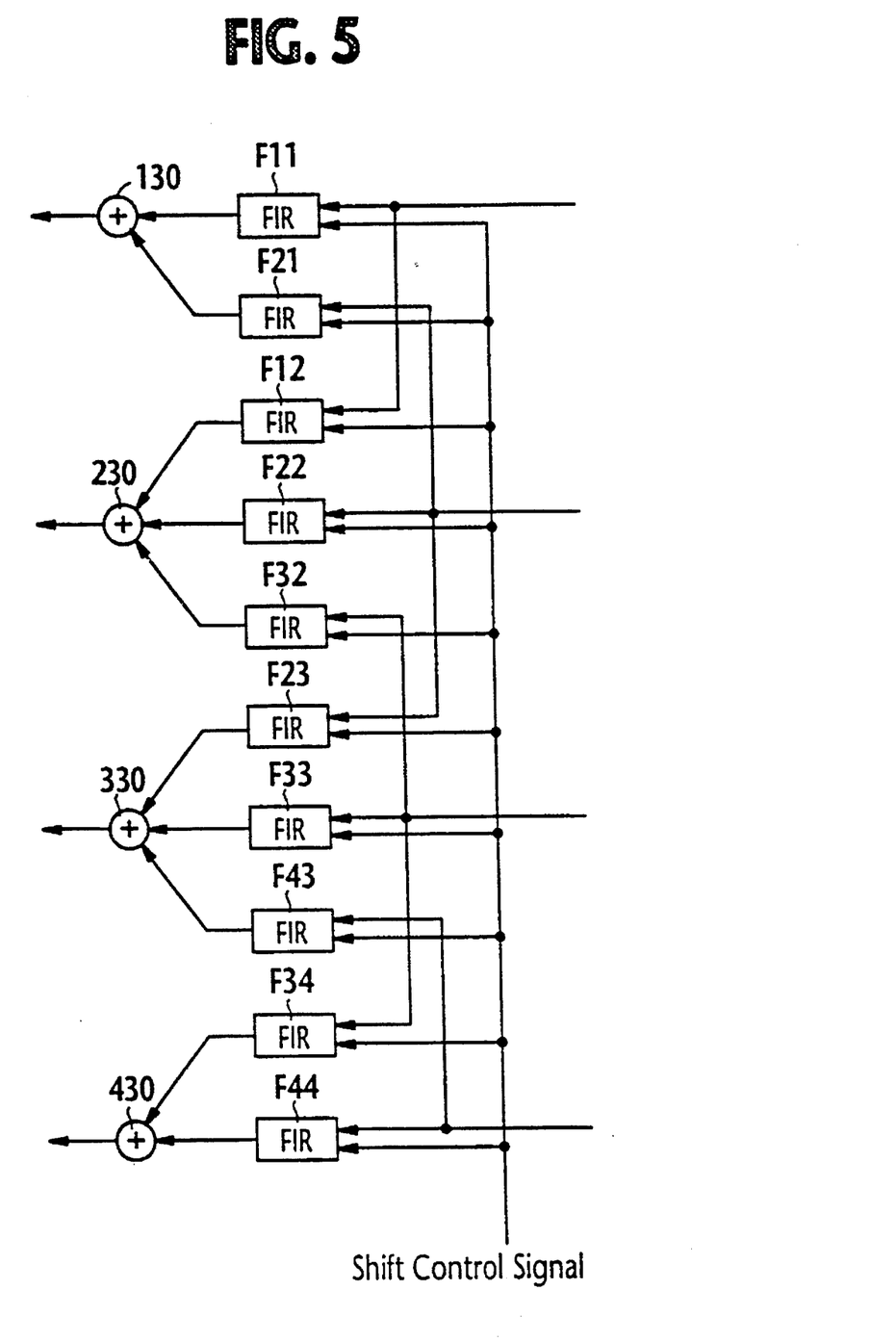
FIG. 5 is a block diagram of a simplified form of the motion compensation circuit.

For this reason, the motion compensation circuit of FIG. 3 can be simplified by eliminating FIR filters of FIG. 3 having insignificant contributing factors in a manner as shown in FIG. 5. According to this embodiment, the first subband signal is passed through FIR filters F11 and F12, the second through F21, F22, F23, the third through F32, F33 and F34, and the fourth through F43 and F44. The outputs of filters F11 and F21 are summed by adder 130, the outputs of filters F12, F22 and F32 being summed by adder 230, the outputs of filters F23, F33 and F43 being summed by adder 330, and finally, the outputs of filters F34 and F44 being summed by adder 430. Therefore, the first subband is contributed by a correction term which is derived only with filter F21 from the second subband, and the second subband is contributed by correction terms derived with filters F12 and F32 respectively from the first and third subbands. Likewise, the third subband is contributed by correction terms derived with filters F23 and F43 respectively from the second and fourth subbands, and the fourth subband is contributed by a correction term derived only with filter F34 from the third subband.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A video coding apparatus comprising:

subband analyzer means for receiving an input video signal of successive frames sampled at an original rate, separating the input video signal into N subband signals and sampling the N subband signals at a rate lower than said original rate;

N subtractors receiving the N sampled subband signals, respectively, for deriving N prediction errors from the received N sampled subband signals and N prediction signals;

N quantizer means connected respectively to said N subtractors for producing N quantized prediction errors;

N dequantizer means for respectively dequantizing outputs of said N quantizer means;

N first adder means for summing outputs of said N dequantizer means with said N prediction signals and producing N locally reproduced subband signals;

N delay means connected respectively to outputs of said N first adder means for introducing a frame delay to each output of said N first adder means;

estimator means for estimating a motion vector from each of a plurality of blocks in each of said frames of the input video signal;

a plurality of finite impulse response (FIR) filters divided into N groups, each group corresponding to one of said N subband signals, one of the FIR filters of each group receiving a delayed signal from one of the delay means which corresponds to the subband signal corresponding to the group, and the remainder of the FIR filters in the group receiving a delayed signal from at least one of said delay means corresponding to at least one of the N subband signals of the other groups, each of said FIR filters having a tapped delay line for producing tap signals from the received delayed signal, a plurality of tap-weight multipliers for respectively multiplying the tap signals with tap weight coefficients which are controlled in response to said motion vector estimated by said estimator means, and an adder for summing output signals of said multipliers to produce an output signal of the FIR filter; and N second adder means respectively corresponding to said N groups of FIR filters and said N first adder means, the second adder means summing the output signals of the FIR filters of the corresponding groups to produce said N prediction signals.

2. A video coding apparatus as claimed in claim 1, wherein each of said groups of FIR filters includes N finite impulse response filters connected respectively to outputs of said delay means.

3. A video communication system having a transmitter and a receiver, the transmitter comprising:

subband analyzer means for receiving an input video signal of successive frames sampled at an original rate, separating the input video signal into N subband signals, and sampling the N subband signals at a rate lower than said original rate;

N subtractors receiving the N sampled subband signals, respectively, for deriving N prediction errors from the received N sampled subband signals and N prediction signals;

N quantizer means connected respectively to said N subtractors for producing N quantized prediction errors;

N dequantizer means for respectively dequantizing outputs of said N quantizer means;

N first adder means for summing outputs of said N dequantizer means with said N prediction signals and producing N locally reproduced subband signals;

N delay means connected respectively to outputs of said N first adder means for introducing a frame delay to each output of said N first adder means;

estimator means for estimating a motion vector from each of a plurality of blocks in each of said frames of the input video signal;

a plurality of finite impulse response (FIR) filters divided into N groups each corresponding to one of said N subband signals, one of the FIR filters of each group receiving a delayed signal from one of the delay means which corresponds to the corresponding one of the subband signal of the group, and the remainder of the FIR filters in the group receiving a delayed signal from at least one of said delay means corresponding to at least one of the N subband signals corresponding to the other groups, each of said FIR filters having a tapped delay line for producing tap signals from the received delayed signal, a plurality of tap-weight multipliers for respectively multiplying the tap signals with tap weight coefficients which are controlled in response to said motion vector estimated by said estimator means, and an adder for summing output signals of said multipliers to produce an output signal of the FIR filter;

N second adder means respectively corresponding to said N groups of FIR filters and said N first adder means, the second adder means summing the output signals of the FIR filters of the corresponding groups to produce said N prediction signals N;

multiplexer means for multiplexing said N quantized prediction errors and said motion vector into a multiplex signal and transmitting the multiplex signal through a transmission medium, said receiver comprising:

demultiplexer means for receiving said multiplex signal through said transmission medium and demultiplexing the received signal into the N quantized prediction errors and the motion vector;

N dequantizer means for dequantizing the demultiplexed N quantized prediction errors;

N first adder means for summing the dequantized N prediction errors with N locally reproduced subband signals;

subband synthesizer means for reconstructing a replica of said video signal from outputs of said N first adder means;

N delay means connected respectively to outputs of said N first adder means for introducing a frame delay to each output of said N first adder means;

a plurality of FIR filters divided into N groups each corresponding to said N subband signals, one of the FIR filters of each group receiving a delayed signal from one of the delay means which corresponds to the corresponding one of the subband signals of the group, and the remainder of the FIR filters in the group receiving a delayed signal from at least one of said delay means corresponding to at least one of the N subband signals corresponding to the other groups, each of said FIR filters having a tapped delay line for producing tap signals from the received delay signal, a plurality of tap-weight multipliers for respectively multiplying the tap signals with tap weight coefficients which are controlled in response to the motion vector demultiplexed by said demultiplexer means, and an adder for summing output signals of said multipliers to produce an output signal of the FIR filter; and N second adder means respectively corresponding to said N groups of FIR filters and said N first adder means, the N second adder means summing the output signals of the FIR filters of the corresponding groups to produce said N locally reproduced subband signals.

4. A video communication system as claimed in claim 3, wherein each of said groups of FIR filters of said transmitter includes N finite impulse response filters connected respectively to outputs of said delay means.

5. A video communication system as claimed in claim 3, wherein each of said groups of FIR filters of said receiver includes N finite impulse response filters connected respectively to outputs of said delay means.

6. A video recording and reproducing system having a recording apparatus, and a reproducing apparatus, the recording apparatus comprising:

subband analyzer means for receiving an input video signal of successive frames sampled at an original rate, separating the input video signal into N subband signals, and sampling said N subband signals at a rate lower than said original rate;

N subtractors receiving the N sampled subband signals, respectively, for deriving N prediction errors from the received N sampled subband signals and N prediction signals;

N quantizer means connected respectively to said N subtractors for producing N quantized prediction errors;

N dequantizer means for respectively dequantizing outputs of said N quantizer means;

N first adder means for summing outputs of said N dequantizer means with said N prediction signals and producing N locally reproduced subband signals;

N delay means connected respectively to outputs of said N first adder means for introducing a frame delay to each output of said N first adder means;

estimator means for estimating a motion vector from each of a plurality of blocks in each of said frames of the input video signal;

a plurality of finite impulse response (FIR) filters divided into N groups each corresponding to one of said N subband signals, one of the FIR filters of each group receiving a delayed signal from one of the delay means which corresponds to the corresponding one of the subband signals of the group, and the remainder of the FIR filters in the group receiving a delayed signal from at least one of said delay means corresponding to at least one of the N subband signals corresponding to the other groups, each of said FIR filters having a tapped delay line for producing tap signals from the received delayed signal, a plurality of tap-weight multipliers for respectively multiplying the tap signals with tap weight coefficients which are controlled in response to said motion vector estimated by said estimator means, and an adder for summing output signals of said multipliers to produce an output signal of the FIR filter;

N second adder means respectively corresponding to said N groups of FIR filters and said N first adder means, the second adder means summing the output signals of the FIR filters of the corresponding groups to produce N outputs and supplying said N outputs as said N prediction signals to said N first adder means and said N subtractor means; and means for recording said N quantized prediction errors and said motion vector into a storage medium, said reproducing apparatus comprising:

means for reproducing the N quantized prediction errors and the motion vector from said storage medium;

N dequantizer means for dequantizing the reproduced N quantized prediction errors;

N first adder means for summing the dequantized N prediction errors with N locally reproduced subband signals;

subband synthesizer means for reconstructing a replica of said video signal from outputs of said N first adder means;

N delay means connected respectively to outputs of said N first adder means for introducing a frame delay to each output of said N first adder means;

a plurality of FIR filters divided into N groups each corresponding to said N subband signals, one of the FIR filters of each group receiving a delayed signal from one of the delay means which corresponds to the corresponding one of the subband signals of the group, and the remainder of the FIR filters in the group receiving a delayed signal from at least one of said delay means corresponding to at least one of the N subband signals corresponding to the other groups, each of said FIR filters having a tapped delay line for producing tap signals from the received delayed signal, a plurality of tap-weight multipliers for respectively multiplying the tap signals with tap weight coefficients which are controlled in response to the reproduced motion vector, and an adder for summing output signals of said multipliers to produce an output signal of the FIR filter; and N second adder means respectively corresponding to said N groups of FIR filters and said N first adder means, the N second adder means summing the output signals of the FIR filters of the corresponding groups to produce said N locally reproduced subband signals.

7. A video recording and reproducing system as claimed in claim 6, wherein each of said groups of FIR filters of said recording apparatus includes N finite impulse response filters connected respectively to outputs of said delay means.

8. A video recording and reproducing system as claimed in claim 6, wherein each of said groups of FIR filters of said reproducing apparatus includes N finite impulse response filters connected respectively to outputs of said delay means.

9. A motion compensation circuit for a video encoder, said encoder including subband analyzer means for receiving a video signal of successive frames sampled at an original rate, separating the input video signal into N subband signals, and sampling the N subband signals at a rate lower than said original rate, N differentiators for deriving N prediction errors from the N sampled subband signals and from outputs of said motion compensation circuit, N first adder means for summing said outputs of the motion compensation circuit and said N prediction errors, N delay means for introducing a predetermined amount of delay to each output of said N first adder means, and a motion estimator for estimating a motion vector from each of a plurality of blocks in each of said frames of the input video signal, said motion compensation circuit comprising:

a plurality of finite impulse response (FIR) filters divided into N groups each corresponding to said N subband signals, one of the FIR filters of each group receiving a delayed signal from one of the delay means which corresponds to the corresponding subband signal of the group, and the remainder FIR filters of the group receiving a delayed signal from at least one of said delay means corresponding to at least one of the N subband signals corresponding to the other groups, each of said FIR filters having a tapped delay line for producing tap signals from the received delayed signal, a plurality of tap-weight multipliers for respectively multiplying the tap signals with tap weight coefficients which are controlled in response to said motion vector estimated by said motion estimator, and an adder for summing out signals of said multiples to produce an output signal of the FIR filter; and N second adder means respectively corresponding to said N groups of FIR filters for summing the output signals of the FIR filters of the corresponding groups to produce said outputs of the motion compensation circuit.

10. A motion compensation circuit as claimed in claim 9, wherein each of said groups of FIR filters includes N finite impulse response filters connected respectively to outputs of said delay means.

* * * * *